(12) United States Patent
Maeda et al.

(10) Patent No.: US 8,859,077 B2
(45) Date of Patent: Oct. 14, 2014

(54) METHOD OF MANUFACTURING MULTILAYER WIRING SUBSTRATE, AND MULTILAYER WIRING SUBSTRATE

(75) Inventors: Shinnosuke Maeda, Nagoya (JP); Tetsuo Suzuki, Niwa-gun (JP); Satoshi Hirano, Chita-gun (JP)

(73) Assignee: NGK Spark Plug Co., Ltd., Nagoya (JP)

( * ) Notice: Subject to any disclaimer, the term of this patent is extended or adjusted under 35 U.S.C. 154(b) by 628 days.

(21) Appl. No.: 13/028,588

(22) Filed: Feb. 16, 2011

(65) Prior Publication Data

US 2011/0200788 A1   Aug. 18, 2011

(30) Foreign Application Priority Data

Feb. 16, 2010   (JP) .................................. 2010-31865

(51) Int. Cl.
| | |
|---|---|
| *B32B 3/24* | (2006.01) |
| *H05K 3/46* | (2006.01) |
| *H05K 1/11* | (2006.01) |
| *H05K 3/20* | (2006.01) |

(52) U.S. Cl.
CPC ........ *H05K 3/4682* (2013.01); *H05K 2201/099* (2013.01); *H05K 1/112* (2013.01); *H05K 3/205* (2013.01); *H05K 2201/09472* (2013.01); *H05K 2201/094* (2013.01)
USPC .............................. 428/138; 216/14; 174/267

(58) Field of Classification Search
USPC ............... 428/138; 216/14; 174/267
See application file for complete search history.

(56) References Cited

U.S. PATENT DOCUMENTS

| | | | |
|---|---|---|---|
| 7,397,000 B2 | 7/2008 | Shimoto et al. | |
| 7,566,834 B2 | 7/2009 | Shimoto et al. | |
| 2005/0230263 A1* | 10/2005 | Dubin ........................... | 205/176 |
| 2005/0252682 A1 | 11/2005 | Shimoto et al. | |
| 2007/0124924 A1 | 6/2007 | Nakamura et al. | |
| 2008/0258283 A1 | 10/2008 | Shimoto et al. | |
| 2008/0308308 A1 | 12/2008 | Kobayashi | |

FOREIGN PATENT DOCUMENTS

| | | |
|---|---|---|
| JP | 2004-111544 | 4/2004 |
| JP | 2005-327780 A | 11/2005 |
| JP | 2007-158174 | 6/2007 |
| JP | 2008-251702 A | 10/2008 |
| JP | 2008-258646 A | 10/2008 |
| JP | 2009-224415 A | 10/2009 |

OTHER PUBLICATIONS

JPO, Office Action issued in corresponding Japanese application No. 2010-031865, mailed Jun. 4, 2013.

* cited by examiner

*Primary Examiner* — William P Watkins, III
(74) *Attorney, Agent, or Firm* — Stites & Harbison, PLLC; Jeffrey A. Haeberlin; Nicolo Davidson

(57) ABSTRACT

A plurality of openings are formed in a resin insulation layer on a bottom surface side of a wiring laminate portion which constitutes a multilayer wiring substrate. A plurality of motherboard connection terminals are disposed to correspond to the openings. The motherboard connection terminals are primarily comprised of a copper layer, and peripheral portions of terminal outer surfaces thereof are covered by the outermost resin insulation layer. A dissimilar metal layer made of at least one metal which is lower in etching rate than copper is formed between an inner main surface of the outermost resin insulation layer and peripheral portions of the terminal outer surfaces.

10 Claims, 10 Drawing Sheets

METHOD OF MANUFACTURING MULTILAYER WIRING SUBSTRATE, AND MULTILAYER WIRING SUBSTRATE

CROSS-REFERENCE TO RELATED APPLICATIONS

The present application claims priority to Japanese Patent Application No. 2010-31865, which was filed on Feb. 16, 2010, the disclosure of which is incorporated by reference in its entirety.

BACKGROUND OF THE INVENTION

1. Field of the Invention

The present invention relates to a multilayer wiring substrate having a laminate structure in which a plurality of resin insulation layers made primarily of the same resin insulation material, and a plurality of conductive layers are laminated alternately in multilayer arrangement, and not having a so-called substrate core in a final product, the substrate core carrying build-up layers successively formed on opposite surfaces thereof. The present invention also relates to a method of manufacturing such a multilayer wiring substrate.

2. Description of Related Art

In association with recent increasing tendency toward higher operation speed and higher functionality of semiconductor integrated circuit devices (IC chips) used as, for example, microprocessors of computers, the number of terminals increases, and the pitch between the terminals tends to become narrower. Generally, a large number of terminals are densely arrayed on the bottom surface of an IC chip and flip-chip-bonded to terminals provided on a motherboard. However, since the terminals of the IC chip differ greatly in pitch from those of the motherboard, difficulty is encountered in bonding the IC chip directly onto the motherboard. Thus, according to an ordinarily employed method, a semiconductor package configured such that the IC chip is mounted on an IC chip mounting wiring substrate is fabricated, and the semiconductor package is mounted on the motherboard.

The IC chip mounting wiring substrate which partially constitutes such a semiconductor package is practicalized in the form of a multilayer substrate configured such that a build-up layer is formed on the front and back surfaces of a substrate core. The substrate core used in the multilayer wiring substrate is, for example, a resin substrate (glass epoxy substrate) formed by impregnating reinforcement fiber with resin. Through utilization of rigidity of the substrate core, resin insulation layers and conductive layers are laminated alternately on the front and back surfaces of the substrate core, thereby forming respective build-up layers. In the multilayer wiring substrate, the substrate core serves as a reinforcement and is formed very thick as compared with the build-up layers. Also, the substrate core has conductor lines (specifically, through-hole conductors, etc.) extending therethrough for electrical communication between the build-up layers formed on the front and back surfaces.

In recent years, in association with implementation of high operation speeds of semiconductor integrated circuit devices, signal frequencies to be used have become those of a high frequency band. In this case, the conductor lines which extend through the substrate core serve as sources of high inductance, leading to the transmission loss of high-frequency signals and thus the occurrence of circuitry malfunction and thus hindering implementation of high operation speed. In order to solve this problem, a multilayer wiring substrate having no substrate core is proposed (refer to, for example, Patent Documents 1 and 2). The multilayer wiring substrates described in Patent Documents 1 and 2 do not use a substrate core, which is relatively thick, thereby reducing the overall wiring length. Thus, the transmission loss of high-frequency signals is lowered, whereby a semiconductor integrated circuit device can be operated at high speed.

In the manufacturing method disclosed in Patent Document 1, a metal foil is disposed one side of a provisional substrate, and a plurality of conductive layers and a plurality of resin insulation layers are alternately stacked on the metal foil to thereby form a build-up layer. Subsequently, the metal foil is separated from the provisional substrate so as to obtain a structure in which the build-up layer is formed on the metal foil. The surface of the outermost layer (the surface of a resin insulation layer and the surfaces of a plurality of connection terminals) is exposed by means of removing the metal foil through etching, whereby a multilayer wiring substrate is manufactured.

Patent Document 1 also discloses a multilayer wiring substrate in which a solder resist film is formed on the build-up layer as the outermost layer thereof. Notably, openings are formed in the solder resist film so as to expose the surfaces of IC-chip connection terminals. In a multilayer wiring substrate disclosed in Patent Document 2 as well, a solder resist film is formed, as the outer most layer, on the side of the wiring substrate where an IC chip is mounted, and openings are formed in the solder resist film so as to expose the top surfaces of IC-chip connection terminals. The solder resist film is made primarily of a hardened photocurable resin insulation material. The openings of the solder resist film are formed through exposure and development performed in a state in which a predetermined mask is disposed on the solder resist film. Subsequently, solder bumps are formed on the top surfaces of the IC-chip connection terminals exposed within the openings of the solder resist film, and an IC chip is mounted via the solder bumps.

PATENT DOCUMENTS

Patent Document 1: Japanese Patent Application Laid-open (kokai) No. 2007-158174. Patent Document 2: Japanese Patent Application Laid-open (kokai) No. 2004-111544

BRIEF SUMMARY OF THE INVENTION

Incidentally, the above-mentioned Patent Document 1 discloses a multilayer wiring substrate in which the surfaces of connection terminals (e.g., motherboard connection terminals to be connected to a motherboard) having a relatively large area are formed such that the surfaces become flush with the outermost resin insulation layer. In this multilayer wiring substrate, in some cases, a stress acts at the boundary between each motherboard connection terminal and the resin insulation layer. Therefore, the disclosed multilayer wiring substrate has a problem in that, as shown in FIG. 25, cracks 103 are generated at the boundary between each motherboard connection terminal 101 and a resin insulation layer 102 in such a manner that the cracks 103 extend from the boundary through the resin insulation layer 102.

In order to solve such a problem, the multilayer wiring substrate may be manufactured such that a solder resist film is formed to cover a peripheral portion of the outer surface of each motherboard connection terminal. Thus, the stress acting at the boundary between each motherboard connection terminal and the resin insulation layer can be reduced. However, when a solder resist film is formed as the outermost layer of the multilayer wiring substrate, due to a difference in coefficient of thermal expansion between the solder resist film and inner resin insulation layers, the substrate warps in accordance with the difference in coefficient of thermal expansion. In this case, since a structure (e.g., a reinforcing plate or the like) is additionally required so as to restrain the warpage, the manufacturing cost of the multilayer wiring substrate increases.

The present invention has been conceived in view of the above problems, and an object of the invention is to provide a method of manufacturing a multilayer wiring substrate, which can manufacture a highly reliable multilayer wiring substrate. Another object of the invention is to provide a highly reliable multilayer wiring substrate which is free from generation of cracks in a resin insulation layer.

According to one aspect of the invention, a means for solving the above problems is a method of manufacturing a multilayer wiring substrate including a laminate structure in which a plurality of resin insulation layers made primarily of a same resin insulation material, and a plurality of conductive layers are laminated alternately in multilayer arrangement, a plurality of first-main-surface-side connection terminals being disposed on a first main surface side of the laminate structure, a plurality of second-main-surface-side connection terminals being disposed on a second main surface side of the laminate structure, the plurality of conductive layers being formed in the plurality of resin insulation layers and interconnected by means of via conductors whose diameters increase toward the first main surface side of the laminate structure or the second main surface side of the laminate structure. The method includes: a metal-conductor-portion-lower-layer forming step of preparing a base material on which a metal foil is separably laminated, and performing copper plating so as to form metal-conductor-portion lower layers, which constitute portions of metal conductor portions, on the metal foil; a resin-insulation-layer forming step of, after the metal-conductor-portion-lower-layer forming step, laminating on the metal foil and the metal-conductor-portion lower layers a build-up material made primarily of the resin insulation material, to thereby form an outermost resin insulation layer on the second main surface side of the laminate structure; a metal-conductor-portion-lower-layer exposing step of exposing upper end surfaces of the metal-conductor-portion lower layers from the outermost resin insulation layer on the second main surface side of the laminate structure; a dissimilar-metal-layer forming step of, after the metal-conductor-portion-lower-layer exposing step, forming a dissimilar metal layer on the upper end surfaces of the metal-conductor-portion lower layers and the outermost resin insulation layer on the second main surface side, the dissimilar metal layer being formed of at least one metal which is lower in etching rate than copper; a metal-conductor-portion-upper-layer forming step of forming metal-conductor-portion upper layers on the dissimilar metal layer at positions corresponding to the upper end surfaces of the metal-conductor-portion lower layers, the metal-conductor-portion upper layers being greater in area than the upper end surfaces and constituting portions of the metal conductor portions; a build-up step of, after the metal-conductor-portion-upper-layer forming step, laminating the plurality of resin insulation layers made of the build-up material, and the plurality of conductive layers alternately in multilayer arrangement, to thereby form the laminate structure; a base-material removing step of, after the build-up step, removing the base material to thereby expose the metal foil; and a connection-terminal forming step of removing the metal foil and at least portions of the metal conductor portions, to thereby form the plurality of second-main-surface-side connection terminals.

According to the aspect of the invention described above, each of the metal conductor portions, which are to become the second-main-surface-side connection terminals, are formed by the metal-conductor-portion lower layer formed on the metal foil, the dissimilar metal layer formed on the upper end surface of the metal-conductor-portion lower layer, and the metal-conductor-portion upper layer formed on the upper end surface of the metal-conductor-portion lower layer via the dissimilar metal layer. Since the dissimilar metal layer is formed of a metal which is lower in etching rate than copper, the dissimilar metal layer functions as an etching stop layer. That is, in the connection-terminal forming step, etching can be controlled in such a manner that the metal-conductor-portion lower layers are gradually removed through etching, and etching removal stops at the dissimilar metal layer. Since this configuration can prevent excessive removal of the metal conductor portions through etching, the adhesion between the resin insulation layer and the second-main-surface-side connection terminals can be secured sufficiently. Furthermore, through etching removal of the metal-conductor-portion lower layers, openings are formed in the outermost resin insulation layer, and the metal-conductor-portion upper layers, which are greater in area than the openings, remain on the inner layer (interior) side of the resin insulation layer. The metal-conductor-portion upper layers remaining on the inner layer (interior) side of the resin insulation layer are used as the second-main-surface-side connection terminals. When the second-main-surface-side connection terminals are formed in this manner, each of the second-main-surface-side connection terminals has a structure in which a peripheral portion of the terminal outer surface is covered by the outermost resin insulation layer, whereby the strength of the second-main-surface-side connection terminals can be increased sufficiently. Also, stress acting at the boundary between each of the second-main-surface-side connection terminals and the resin insulation layers can be mitigated, and the possibility of generation of cracks in the resin insulation layers decreases. Moreover, the outermost resin insulation layer is formed of the same build-up material as that used for forming the inner layers. Therefore, the influence of the difference in thermal expansion coefficient in the laminate structure can be mitigated as compared with the case where the outermost resin insulation layer is formed of a different resin insulation material. As a result, warpage of the multilayer wiring substrate can be restrained.

The method may comprise a resist-film forming step which is performed between the dissimilar-metal-layer forming step and the metal-conductor-portion-upper-layer forming step so as to form on the dissimilar metal layer a plating resist film having openings at positions corresponding to the upper end surfaces, the openings being greater in area than the upper end surfaces; and a resist-film removing step and a dissimilar-metal-layer removing step which are performed between the metal-conductor-portion-upper-layer forming step and the build-up step, the resist-film removing step removing the resist film, and the dissimilar-metal-layer removing step partially removing the dissimilar metal layer through etching of exposed portions of the dissimilar metal layer. In this case, the metal-conductor-portion upper layers, which are greater in area than the upper end surfaces of the metal-conductor-portion lower layers can be reliably formed in the openings of the plating resist film. Furthermore, since the plating resist film and exposed portions of the dissimilar metal layer are removed after formation of the metal-conductor-portion upper layers, the laminate structure can be reliably formed in the build-up step.

The method may be such that, in the connection-terminal forming step, the exposed metal foil and the metal-conductor-portion lower layers are removed through etching so as to form a plurality of openings in the outermost resin insulation layer on the second main surface side, and a protection metal layer is formed on the dissimilar metal layer exposed inside the openings, whereby the plurality of second-main-surface-side connection terminals are formed.

In this case, the second-main-surface-side connection terminals can be reliably protected by the protection metal layer, whereby the reliability of the multilayer wiring substrate can be increased.

The method may be such that, in the connection-terminal forming step, the exposed metal foil and the metal-conductor-portion lower layers are removed through etching so as to form a plurality of openings in the outermost resin insulation layer on the second main surface side, the dissimilar metal layer exposed inside the openings is removed through etching, and a protection metal layer is formed on the exposed metal-conductor-portion upper layers, whereby the plurality of second-main-surface-side connection terminals are formed. In this case, since the dissimilar metal layer is removed, the protection metal layer can be reliably formed on the metal-conductor-portion upper layers. Moreover, the second-main-surface-side connection terminals can be reliably protected by the protection metal layer, whereby the reliability of the multilayer wiring substrate can be increased.

The dissimilar metal layer may be formed of at least one metal selected from a group consisting of gold, nickel, chromium, titanium, cobalt, palladium, tin, and silver. Furthermore, preferably, each metal-conductor-portion upper layer is mainly formed of a copper layer, and, more preferably, each metal-conductor-portion upper layer is a copper plating layer formed through copper electroplating.

According to another aspect of the invention, a multilayer wiring substrate includes a laminate structure in which a plurality of resin insulation layers made primarily of a same resin insulation material, and a plurality of conductive layers are laminated alternately in multilayer arrangement, a plurality of first-main-surface-side connection terminals being disposed on a first main surface side of the laminate structure, and a plurality of second-main-surface-side connection terminals being disposed on a second main surface side of the laminate structure, the plurality of conductive layers being formed in the plurality of resin insulation layers and interconnected by means of via conductors whose diameters increase toward the first main surface side of the laminate structure or the second main surface side of the laminate structure. An outermost resin insulation layer on the second main surface side of the laminate structure has a plurality of openings which expose portions of terminal outer surfaces of the second-main-surface-side connection terminals; the second-main-surface-side connection terminals are primarily comprised of a copper layer, and peripheral portions of the terminal outer surfaces of the second-main-surface-side connection terminals are covered by the outermost resin insulation layer; and a dissimilar metal layer made of at least one metal which is lower in etching rate than copper is formed between an inner main surface of the outermost resin insulation layer and at least the peripheral portions of the terminal outer surfaces.

According to this aspect of the invention described above, the multilayer wiring substrate is formed such that a plurality of resin insulation layers made primarily of the same resin insulation material, and a plurality of conductive layers are laminated alternately, and assumes the form of a coreless wiring substrate having no substrate core. In this multilayer wiring substrate, the plurality of resin insulation layers which constitute the laminate structure are formed of a hardened resin insulation material that is not photocurable. In this case, the influence of a difference in thermal expansion coefficient in the laminate structure can be mitigated, as compared with the case where the outermost resin insulation layers are formed of a different resin insulation material. As a result, warpage of the multilayer wiring substrate can be restrained. Furthermore, since the outermost resin insulation layers, in which the connection terminals are formed, are formed of the same build-up material having excellent electrical insulation performance as that used to form the inner resin insulation layers, the interval between the connection terminals can be narrowed, so that the multilayer wiring substrate can be further integrated. Also, the exposed outermost resin insulation layer on the second main surface side of the laminate structure has a plurality of openings formed therein so as to expose portions of the terminal outer surfaces of the plurality of second-main-surface-side connection terminals. Peripheral portions of the terminal outer surfaces of the second-main-surface-side connection terminals are covered by the outermost resin insulation layer. That is, peripheral portions of the second-main-surface-side connection terminals are buried (embedded) in the outermost resin insulation layer. Accordingly, the strength of the second-main-surface-side connection terminals can be increased sufficiently. When the second-main-surface-side connection terminals are formed in this manner, stress acting at the boundary between each of the connection terminals and the resin insulation layer can be mitigated. Therefore, the possibility of generation of cracks in the resin insulation layers decreases. Moreover, the dissimilar metal layer formed of at least one metal which is lower in etching rate than copper is formed at the boundary between the inner main surface of the outermost resin layer and peripheral portions of the terminal outer surfaces of the second-main-surface-side connection terminals. Since this dissimilar metal layer is lower in etching rate than copper, the dissimilar metal layer functions as an etching stop layer when the openings and the second-main-surface-side connection terminals are formed through etching of the copper layer. According, the copper layer which constitutes the second-main-surface-side connection terminals can be prevented from being excessively removed through etching, whereby the adhesion between the resin insulation layer and the second-main-surface-side connection terminals can be secured sufficiently.

The second-main-surface-side connection terminals may be provided on the main surface to which a motherboard is connected, or provided on the opposite main surface; i.e., the main surface onto which an IC chip is mounted.

Preferred examples of the material used to form the resin insulation layers include thermosetting resins, such as epoxy resin, phenol resin, urethane resin, silicone resin, and polyimide resin; and thermoplastic resins, such as polycarbonate resin, acrylic resin, polyacetal resin, and polypropylene resin. Additionally, there may be used a composite material consisting of any one of these resins, and glass fiber (glass woven fabric or glass nonwoven fabric) or organic fiber, such as polyamide fiber, or a resin-resin composite material in which a three-dimensional network fluorine-containing resin base material, such as continuously porous PTFE, is impregnated with a thermosetting resin, such as epoxy resin.

Notably, in the present invention, "a plurality of resin insulation layers made primarily of the same resin insulation material" may be a plurality of resin insulation layers which differ in additive, such as the above-mentioned organic fiber, which is mixed with, for example, thermo setting resin, if the resin insulation layers are mainly formed of the same thermo setting resin.

Other features and advantages of the invention will be set forth in, or apparent from, the detailed description of exemplary embodiments of the invention found below.

DETAIL DESCRIPTION OF EXEMPLARY EMBODIMENTS OF THE INVENTION

Figure 1:
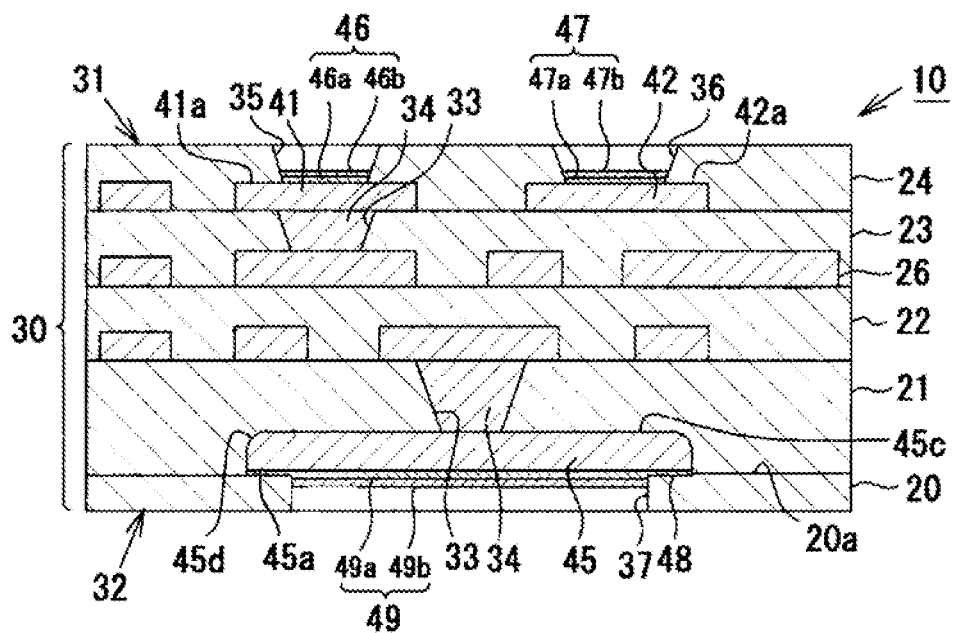
FIG. 1 is a sectional view schematically showing the structure of a multilayer wiring substrate according to one embodiment.
Figure 2:
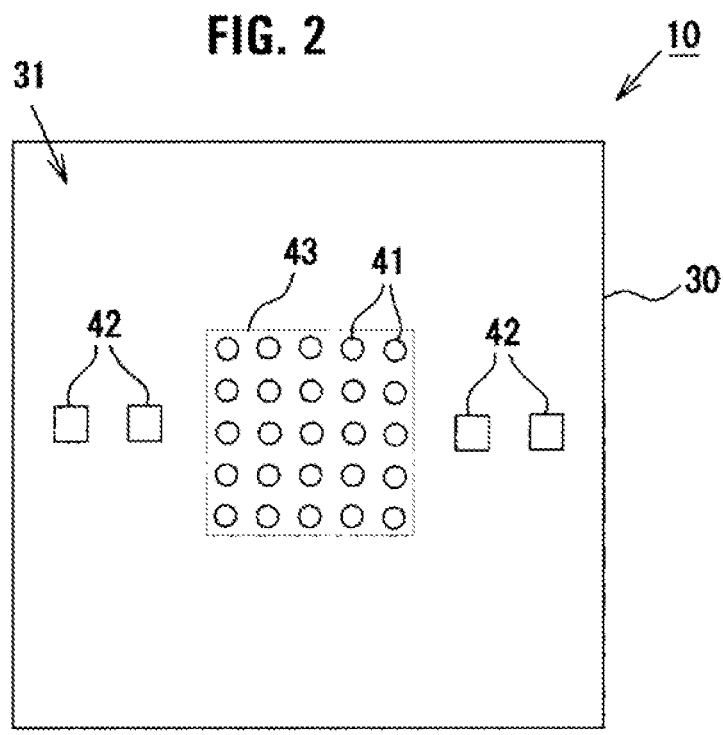
FIG. 2 is a plan view schematically showing the structure of the multilayer wiring substrate.
Figure 3:
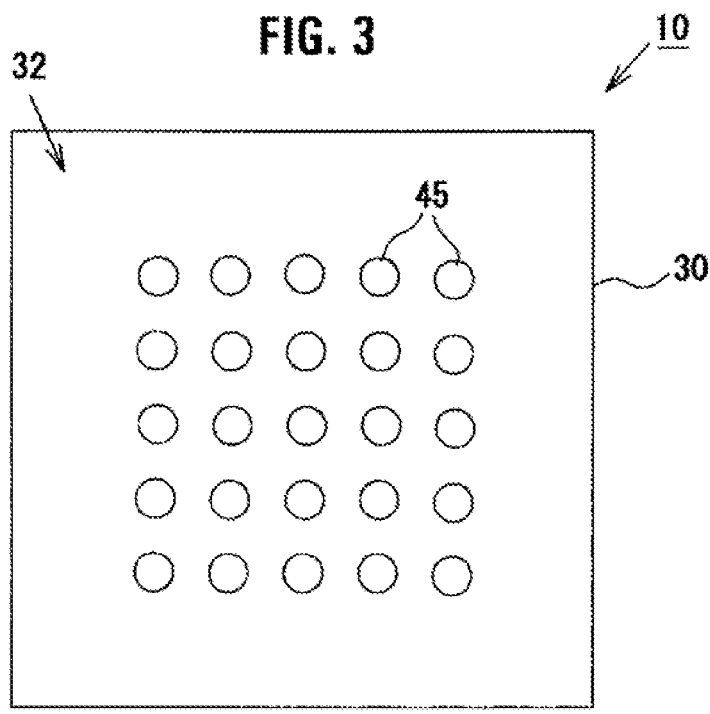
FIG. 3 is a plan view schematically showing the structure of the multilayer wiring substrate.

A multilayer wiring substrate according to one embodiment of the present invention will next be described in detail with reference to the drawings. FIG. 1 is an enlarged sectional view schematically showing the structure of the multilayer wiring substrate of the present embodiment. FIG. 2 is a plan view of the multilayer wiring substrate as viewed from the top surface side. FIG. 3 is a plan view of the multilayer wiring substrate as viewed from the bottom surface side.

As shown in FIG. 1, a multilayer wiring substrate 10 is a coreless wiring substrate having no substrate core and has a multilayer wiring laminate portion 30 (laminate structure) in which a plurality of resin insulation layers 20, 21, 22, 23, and 24 made primarily of the same resin insulation material, and a plurality of conductive layers 26 made of copper are laminated alternately. The resin insulation layers 20 to 24 are formed of a build-up material made primarily of a hardened resin insulation material that is not photocurable; specifically, a hardened thermosetting epoxy resin. In the multilayer wiring substrate 10, a plurality of connection terminals 41 and 42 (first-main-surface-side connection terminals) are disposed on one side (first main surface side) of the wiring laminate portion 30 where a top surface 31 thereof is present.

As shown in FIGS. 1 and 2, in the multilayer wiring substrate 10 of the present embodiment, the plurality of connection terminals 41 and 42 disposed on the top surface 31 side of the wiring laminate portion 30 are IC-chip connection terminals 41 to which an IC chip is connected, and capacitor connection terminals 42 to which chip capacitors are connected. On the top surface 31 side of the wiring laminate portion 30, the plurality of IC-chip connection terminals 41 are arrayed in a chip mounting region 43 provided at a central portion of the multilayer wiring substrate 10. The capacitor connection terminals 42 are greater in area than the IC-chip connection terminals 41 and are disposed externally of the chip mounting region 43.

Meanwhile, as shown in FIGS. 1 and 3, on the other side (second main surface side) of the wiring laminate portion 30 where a bottom surface 32 thereof is present, a plurality of connection terminals 45 (motherboard connection terminals serving as second-main-surface-side connection terminals) for LGA (land grid array) to which a motherboard is connected are arrayed. The motherboard connection terminals 45 are greater in area than the IC-chip connection terminals 41 and the capacitor connection terminals 42 on the top surface 31 side.

Via holes 33 and filled-via conductors 34 are provided in the resin insulation layers 21, 22, 23, and 24. The via conductors 34 are shaped such that their diameters increase in the same direction (in FIG. 1, in the direction from the bottom surface toward the top surface). The via conductors 34 electrically interconnect the conductive layers 26, the IC-chip connection terminals 41, the capacitor connection terminals 42, and the motherboard connection terminals 45.

A plurality of openings 35 and 36 are formed in the resin insulation layer 24 which is exposed to the outside and serves as an outermost layer on the top surface 31 side of the wiring laminate portion 30. The IC-chip connection terminals 41 and the capacitor connection terminals 42 are disposed to correspond to these openings 35 and 36. Specifically, the IC-chip connection terminals 41 are disposed within the openings 35 such that their terminal outer surfaces 41a are lower in height than the surface of the resin insulation layer 24. Peripheral portions of the terminal outer surfaces 41a are covered by the outermost resin insulation layer 24. That is, the IC-chip connection terminals 41 are greater in size than the openings 35, and peripheral portions of the terminal outer surfaces 41a are buried (embedded) in the resin insulation layer 24.

Furthermore, the capacitor connection terminals 42 are disposed within the openings 36 such that their terminal outer surfaces 42a are lower in height than the surface of the resin insulation layer 24. Peripheral portions of the terminal outer surfaces 42a are covered by the outermost resin insulation layer 24. That is, the capacitor connection terminals 42 are greater in size than the openings 36, and peripheral portions of the terminal outer surfaces 42a are buried (embedded) in the resin insulation layer 24. The IC-chip connection terminals 41 and the capacitor connection terminals 42 are mainly formed by a copper layer. Each of the IC-chip connection terminals 41 and the capacitor connection terminals 42 has a structure in which only portions of the upper surface of the copper layer which portions are exposed to the openings 35 and 36 are covered by plating layers 46 and 47, respectively, the plating layers being formed of a material other than copper (specifically, nickel plating layers 46a and 47a, and gold plating layers 46b and 47b).

A plurality of openings 37 are formed in the resin insulation layer 20 which is exposed to the outside and serves as an outermost layer on the bottom surface 32 side of the wiring laminate portion 30. The motherboard connection terminals 45 are disposed to correspond to these openings 37. Specifically, the motherboard connection terminals 45 are disposed within the openings 37 such that their terminal outer surfaces 45a are lower in height than the surface of the resin insulation layer 20. Peripheral portions of the terminal outer surfaces 45a are covered by the outermost resin insulation layer 20. That is, the motherboard connection terminals 45 are greater in size than the openings 37, and peripheral portions of the terminal outer surfaces 45a are buried (embedded) in the resin insulation layer 20. Each of the motherboard connection terminals 45 is rounded along the edge 45d of a terminal inner surface 45c.

The motherboard connection terminals 45 are mainly formed by a copper layer. A dissimilar metal layer 48 is formed on the terminal outer surface 45a located on the side toward the opening 37, so as to cover the entire outer surface. The dissimilar metal layer 48 is formed of a metal (e.g., nickel) which is lower in etching rate than copper. Further, each of the motherboard connection terminals 45 has a plating layer 49 (specifically, a nickel plating layer 49a and a gold plating layer 49b), as a protection metal layer, formed on the dissimilar metal layer 48 exposed inside the opening 37. In the present embodiment, inside the opening 37, the nickel plating layer 49a, which constitutes the plating layer 49, is formed on a nickel plating layer, which constitutes the dissimilar metal layer 48. The thickness of the nickel plating layer is greater than that at a peripheral portion of the terminal outer surface 45a. The dissimilar metal layer 48 inside the opening 37 also functions as a protection metal layer. A motherboard is connected to the motherboard connection terminals 45 via unillustrated solder.

The thus-configured multilayer wiring substrate 10 is fabricated by, for example, the following procedure.

First, a support substrate (a glass epoxy substrate or the like) having sufficient strength is prepared. On the support substrate, the resin insulation layers 20 to 24 and the conductive layers 26 are alternately built up, thereby forming the wiring laminate portion 30.

Figure 4:
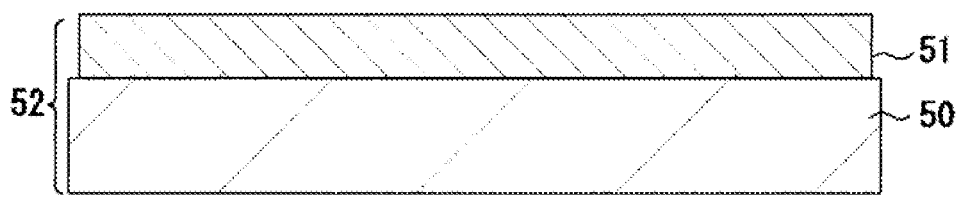
FIG. 4 is an explanatory view showing a method of manufacturing the multilayer wiring substrate.

More specifically, as shown in FIG. 4, a sheet-like electrically insulative resin base material made of epoxy resin and serving as a ground resin insulation layer 51 is attached onto a support substrate 50, thereby yielding a base material 52 consisting of the support substrate 50 and the ground resin insulation layer 51.

Figure 5:
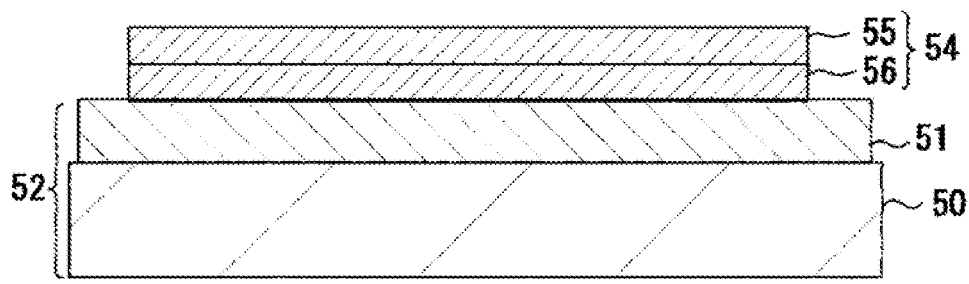
FIG. 5 is an explanatory view showing the method of manufacturing the multilayer wiring substrate.

Then, as shown in FIG. 5, a metal laminate sheet 54 is disposed on the upper surface of the ground resin insulation layer 51 of the base material 52 (base-material preparation step). Through disposition of the metal laminate sheet 54 on the ground resin insulation layer 51, there is ensured such adhesion that, in the subsequent fabrication process, the metal laminate sheet 54 is not separated from the ground resin insulation layer 51. The metal laminate sheet 54 is configured such that two copper foils 55 and 56 (a pair of metal foils) are separably in close contact with each other. Specifically, the copper foils 55 and 56 are laminated together with metal plating (e.g., chromium plating, nickel plating, titanium plating, or composite plating thereof) intervening therebetween, thereby forming the metal laminate sheet 54.

Figure 6:
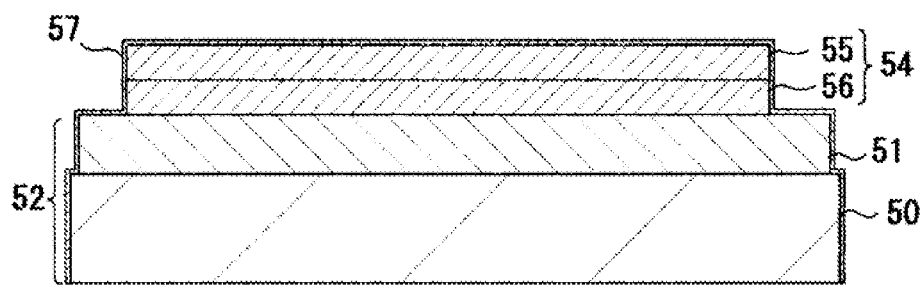
FIG. 6 is an explanatory view showing the method of manufacturing the multilayer wiring substrate.

A metal-conductor-portion-lower-layer forming step is performed after the base-material preparation step. Specifically, electroless copper plating is performed so as to form a full-surface plating layer 57 which covers the metal laminate sheet 54 and base material 52 (see FIG. 6).

Figure 7:
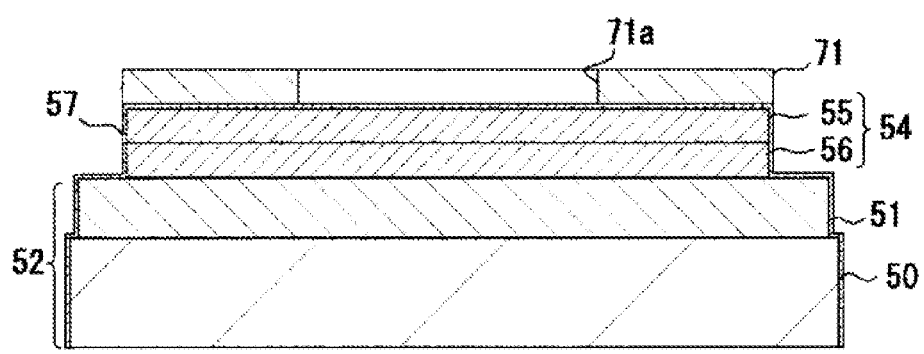
FIG. 7 is an explanatory view showing the method of manufacturing the multilayer wiring substrate.

Subsequently, a dry film for forming a plating resist film is laminated on the upper surface of the metal laminate sheet 54, and exposure and development are carried out for the dry film. As a result, there is formed a plating resist film 71 of a predetermined pattern, which has openings 71a at positions corresponding to the motherboard connection terminals 45 (see FIG. 7).

Figure 8:
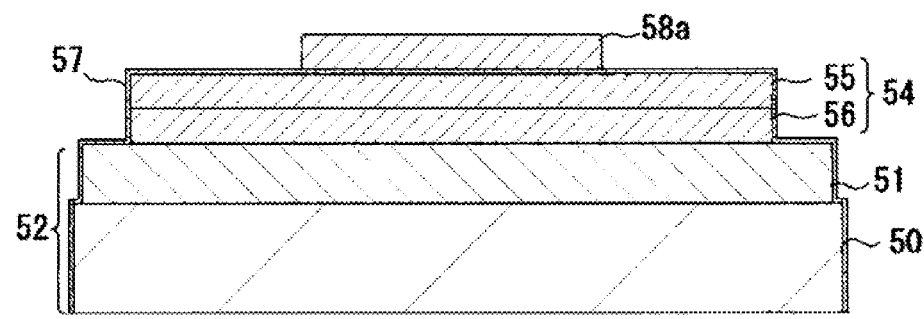
FIG. 8 is an explanatory view showing the method of manufacturing the multilayer wiring substrate.

Afterward, copper electroplating is selectively performed with the plating resist film 71 formed, whereby metal-conductor-portion lower layers 58a, which constitute portions of the metal conductor portions, are formed on the metal laminate sheet 54. The plating resist film 71 is then peeled off (see FIG. 8). Furthermore, in order to enhance adhesion between the resin insulation layer 20 and the metal-conductor-portion lower layers 58a, the surfaces of the metal-conductor-portion lower layers 58a are roughened (treatment performed by use of a CZ-series etching agent available from MEC Co., Ltd.).

Figure 9:
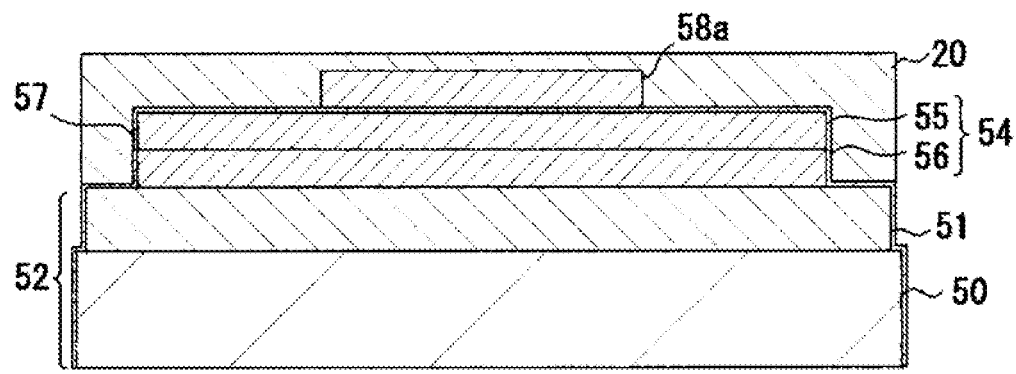
FIG. 9 is an explanatory view showing the method of manufacturing the multilayer wiring substrate.

After that, as shown in FIG. 9, the sheet-like resin insulation layer 20 is disposed on and attached onto the base material 52 in such a manner as to cover the metal laminate sheet 54, on which the metal-conductor-portion lower layers 58a have been formed (resin-insulation-layer forming step). At this time, the resin insulation layer 20 comes into close contact with the metal laminate sheet 54 and the conductor-portion lower layers 58a, and comes into close contact with the ground resin insulation layer 51 in a region around the metal laminate sheet 54, thereby sealing in the metal laminate sheet 54.

Figure 10:
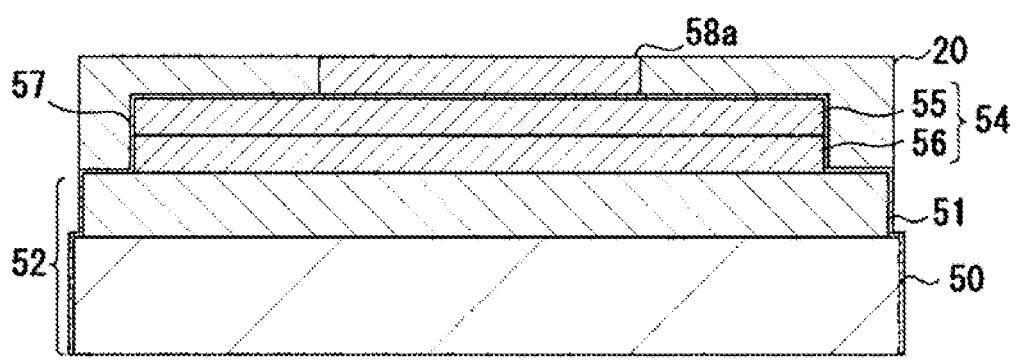
FIG. 10 is an explanatory view showing the method of manufacturing the multilayer wiring substrate.

Subsequently, as shown in FIG. 10, the upper end surfaces of the metal-conductor-portion lower layers 58a are exposed from the resin insulation layer 20 by means of performing, for example, buffing (metal-conductor-portion-lower-layer exposing step). After that, by use of etchant, such as a potassium permanganate solution, a desmear step is performed for removing smears on the metal-conductor-portion lower layers 58a.

Figure 11:
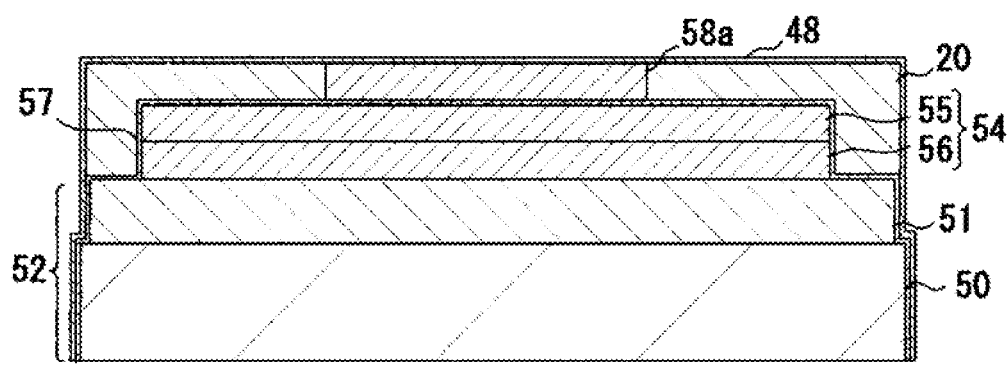
FIG. 11 is an explanatory view showing the method of manufacturing the multilayer wiring substrate.

After the desmear step, as shown in FIG. 11, electroless nickel plating is performed so as to form the dissimilar metal layer 48 which covers the resin insulation layer 20 and the upper end surfaces of the metal-conductor-portion lower layers 58a (dissimilar-metal-layer forming step).

Figure 12:
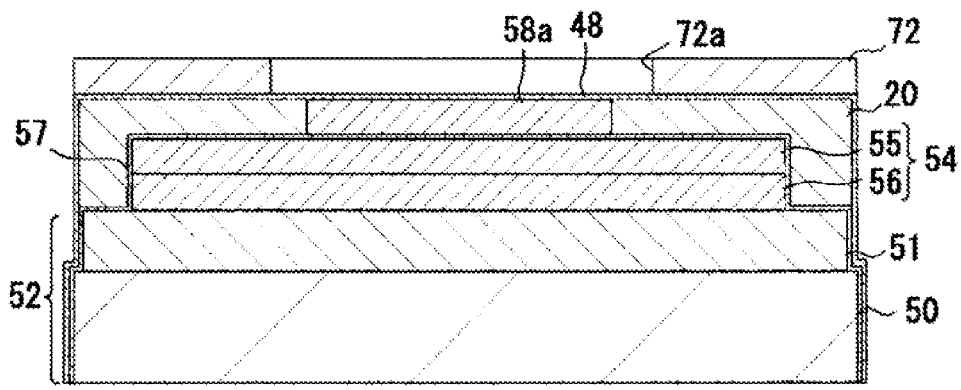
FIG. 12 is an explanatory view showing the method of manufacturing the multilayer wiring substrate.

A metal-conductor-portion-upper-layer forming step is performed after the dissimilar-metal-layer forming step. Specifically, a dry film for forming a plating resist film is laminated on the upper surface of the resin insulation layer 20, and exposure and development are carried out for the dry film. As a result, as shown in FIG. 12, there is formed a plating resist film 72 of a predetermined pattern, which has openings 72a at positions corresponding to the upper end surfaces of the metal-conductor-portion lower layers 58a, the openings 72a being greater in area than the upper end surfaces of the metal-conductor-portion lower layers 58a (resist-film forming step).

Figure 13:
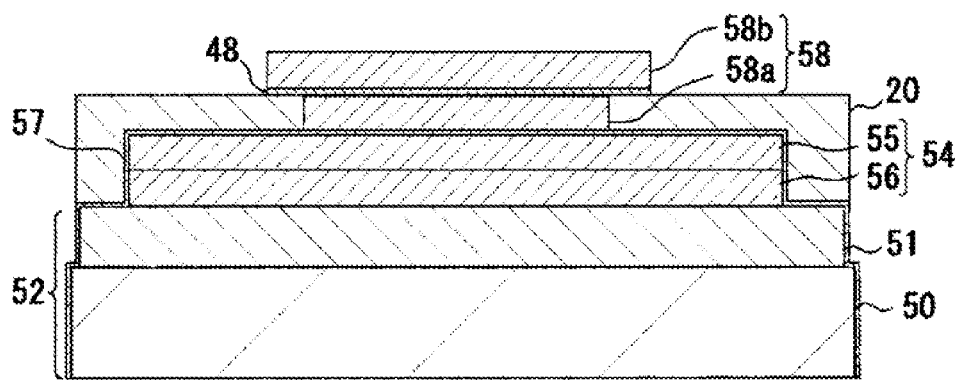
FIG. 13 is an explanatory view showing the method of manufacturing the multilayer wiring substrate.

Subsequently, copper electroplating is selectively performed with the plating resist film 72 formed, whereby metal-conductor-portion upper layers 58b, which constitute portions of the metal conductor portions 58, are formed in the openings 72a (see FIG. 13). The plating resist film 72 is then peeled off (resist-film removing step).

Moreover, etching is performed so as to remove exposed portions of the dissimilar metal layer 48 from the surface of the resin insulation layer 20 (dissimilar-metal-layer removing step). Through the above-described steps, the metal conductor portions 58 composed of the metal-conductor-portion lower layers 58a and metal-conductor-portion upper layers 58b are formed.

Figure 14:
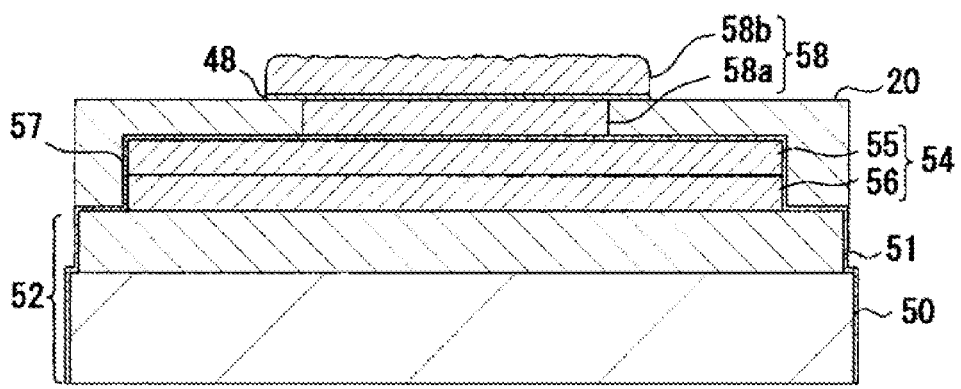
FIG. 14 is an explanatory view showing the method of manufacturing the multilayer wiring substrate.

After formation of the metal conductor portions 58, in order to enhance adhesion between each metal conductor portion 58 and the resin insulation layer 21, the surface of each metal conductor portion 58 is roughened (treatment performed by use of a CZ-series etching agent available from MEC Co., Ltd.) (see FIG. 14). At that time, the surface of each metal conductor portion 58 is roughened, and the edge of the metal conductor portion 58 is rounded.

Figure 15:
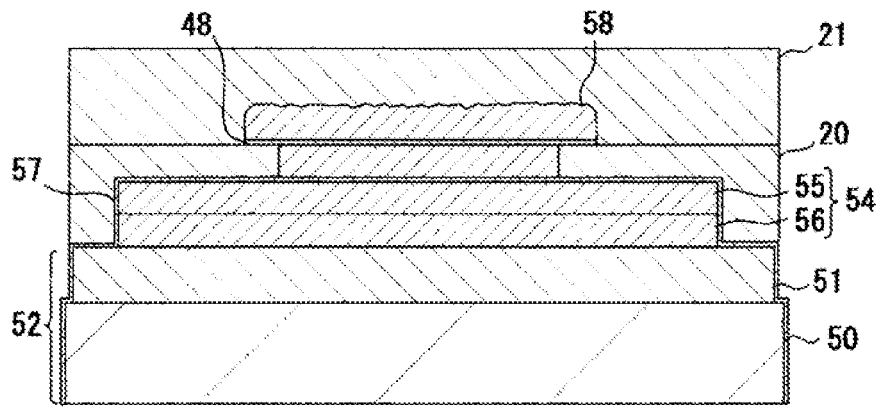
FIG. 15 is an explanatory view showing the method of manufacturing the multilayer wiring substrate.

After that, the sheet-like resin insulation layer 21 is disposed on and attached onto the upper surface of the resin insulation layer 20 having the metal conductor portions 58 formed therein (see FIG. 15).

Figure 16:
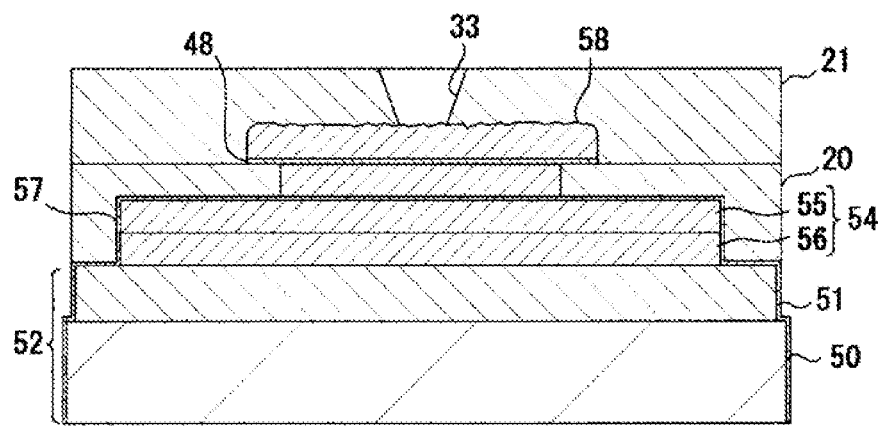
FIG. 16 is an explanatory view showing the method of manufacturing the multilayer wiring substrate.

Then, as shown in FIG. 16, the via holes 33 are formed in the resin insulation layer 21 at predetermined positions (positions above the metal conductor portions 58) by means of performing laser beam machining by use of, for example, excimer laser, UV laser, or CO2 laser. Next, by use of etchant, such as a potassium permanganate solution, a desmear step is performed for removing smears from inside the via holes 33. In the desmear step, in place of treatment by use of etchant, plasma asking by use of, for example, O2 plasma may be performed.

Figure 17:
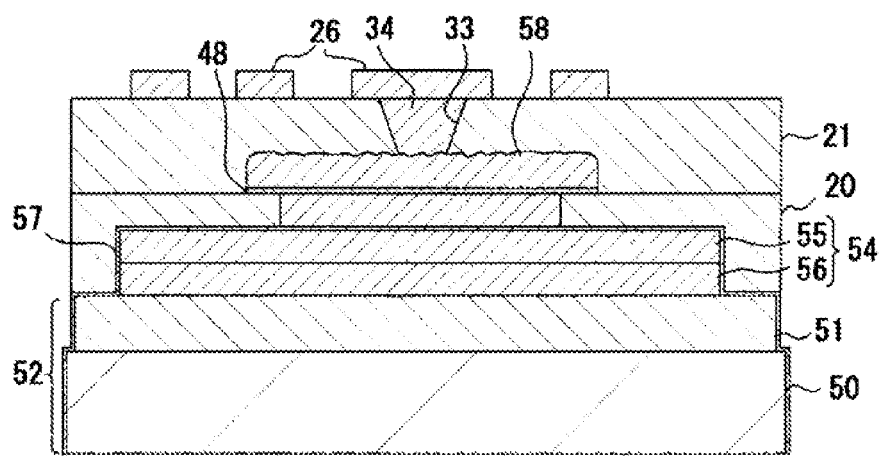
FIG. 17 is an explanatory view showing the method of manufacturing the multilayer wiring substrate.

After the desmear step, electroless copper plating and copper electroplating are performed by a known process, thereby forming the via conductors 34 in the via holes 33. Further, etching is performed by a known process (e.g., semi-additive process), thereby forming the conductive layer 26 in a predetermined pattern on the resin insulation layer 21 (see FIG. 17).

Also, other resin insulation layers 22 to 24 and the corresponding conductive layers 26 are formed and laminated on the resin insulation layer 21 by processes similar to those used to form the resin insulation layer 21 and the associated conductive layer 26. Subsequently, laser drilling is performed on the outermost resin insulation layer 24, thereby forming the plurality of openings 35 and 36 (see FIG. 18). Next, there is performed a desmear step of removing smears from inside the openings 35 and 36 by use of, for example, a potassium permanganate solution or O2 plasma.

Figure 18:
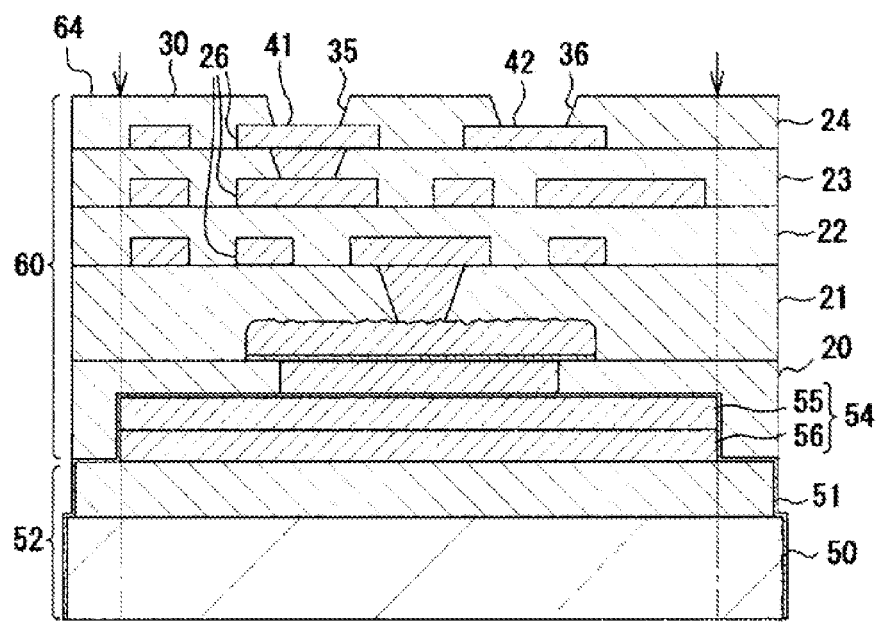
FIG. 18 is an explanatory view showing the method of manufacturing the multilayer wiring substrate.

By the above-described build-up step, there is formed a wiring laminate 60 in which the metal laminate sheet 54, the resin insulation layers 20 to 24, and the conductive layers 26 are laminated on the base material 52. Notably, as shown in FIG. 18, a portion of the wiring laminate 60 which is located above the metal laminate sheet 54 will become the wiring laminate portion 30 of the multilayer wiring substrate 10. Furthermore, in the wiring laminate 60, portions of the conductive layer 26 formed between the resin insulation layers 23 and 24 exposed to the outside via the openings 35 will become the IC-chip connection terminals 41, and portions of the conductive layer 26 exposed to the outside via the openings 36 will become the capacitor connection terminals 42.

After the build-up step, the wiring laminate 60 is cut by a dicing apparatus (not shown) so as to remove a surrounding portion around the wiring laminate portion 30 (cutting step). At this time, as shown in FIG. 18, cutting progresses along the boundary (indicated by the arrows in FIG. 18) between the wiring laminate portion 30 and a surrounding portion 64 and along the extension of the boundary for further cutting of the base material 52 (the support substrate 50 and the ground resin insulation layer 51) located under the wiring laminate portion 30. As a result of this cutting, a peripheral edge portion of the metal laminate sheet 54 which has been sealed in the resin insulation layer 20 is exposed. That is, as a result of removal of the surrounding portion 64, a bonded portion between the ground resin insulation layer 51 and the resin insulation layer 20 is lost. Consequently, the wiring laminate portion 30 and the base material 52 are connected together merely through the metal laminate sheet 54.

Figure 19:
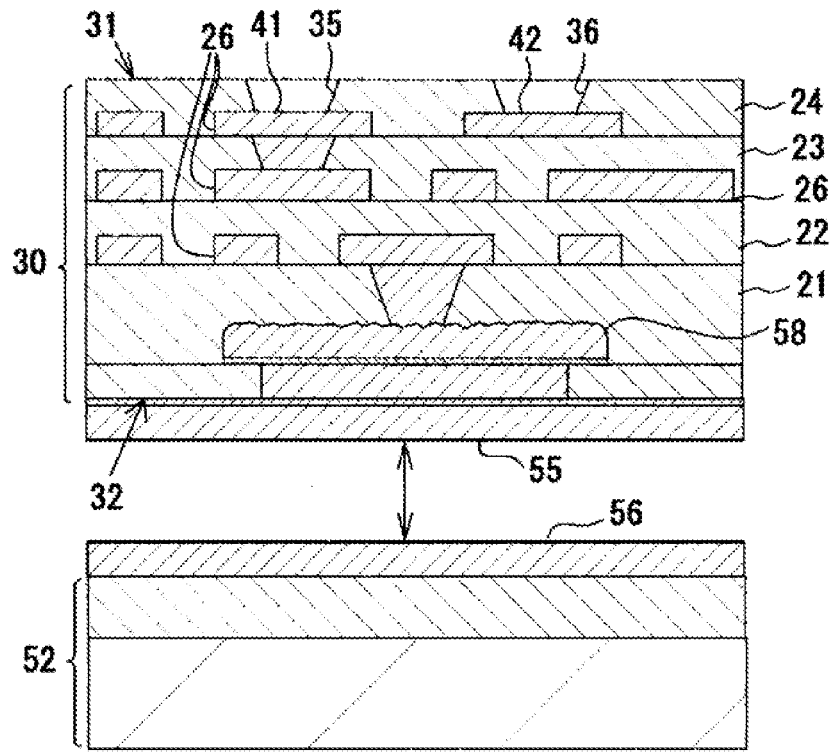
FIG. 19 is an explanatory view showing the method of manufacturing the multilayer wiring substrate.

As shown in FIG. 19, the wiring laminate portion 30 and the base material 52 are separated from each other at the interface between the copper foils 55 and 56 of the metal laminate sheet 54, thereby removing the base material 52 from the wiring laminate portion 30 and exposing the copper foil 55 present on the bottom surface 32 of the wiring laminate portion 30 (the resin insulation layer 20) (base-material removing step).

Figure 20:
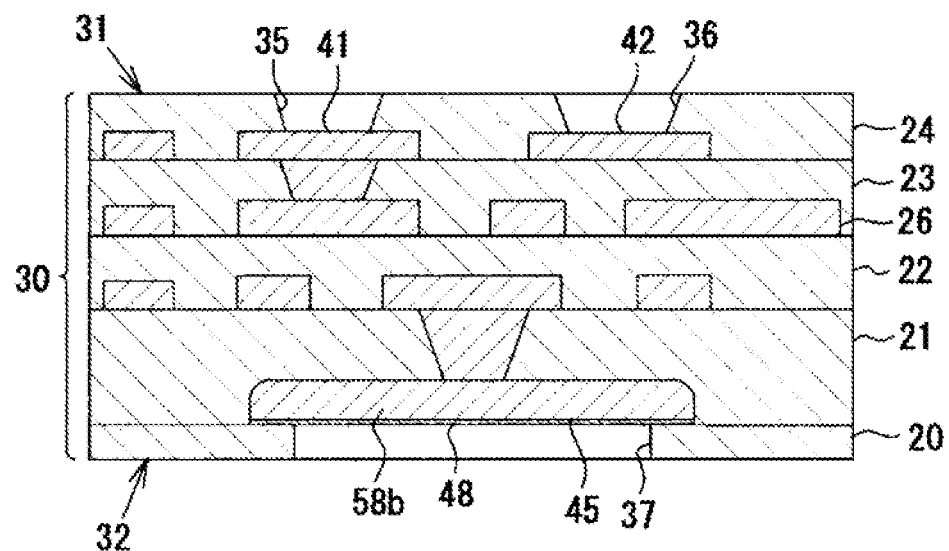
FIG. 20 is an explanatory view showing the method of manufacturing the multilayer wiring substrate.

Subsequently, on the bottom surface 32 side of the wiring laminate portion 30, the exposed copper foil 55 and portions of the metal conductor portions 58 are removed through etching, whereby the motherboard connection terminals 45 are formed (connection-terminal forming step). Specifically, a dry film for forming an etching resist film is laminated on the top surface 31 of the wiring laminate portion 30, and exposure and development are performed for the dry film to thereby form an etching resist film which covers the entirety of the top surface 31. In this state, etching is performed for the wiring laminate portion 30 so as to remove the entire copper foil 55 and remove the metal-conductor-portion lower layers 58a, which partially constitute the metal conductor portions 58. As a result, the openings 37 are formed in the resin insulation layer 24. At that time, since the dissimilar metal layer 48 formed on the surface of each metal-conductor-portion upper layer 58b is lower in etching rate than copper, the dissimilar metal layer 48 functions as an etching stop layer. Therefore, the metal-conductor-portion upper layer 58b remains on the inner-layer side of each opening 37, and becomes the motherboard connection terminal 45 (see FIG. 20)

Subsequently, electroless nickel plating and electroless gold plating are sequentially performed on the surfaces of the IC-chip connection terminals 41, the surfaces of the capacitor connection terminals 42, and the surfaces of the motherboard connection terminals 45, thereby forming the nickel-gold plating layers 46, 47, and 49, which are composed of the nickel plating layers 46a, 47a, and 49a and the gold plating layers 46b, 47b, and 49b, respectively (plating step). By going through the above-mentioned steps, the multilayer wiring substrate 10 of FIG. 1 is manufactured. Notably, in the present embodiment, after the terminal-connector forming step, the dissimilar metal layer 48 (nickel plating layer) remains on the surface of each motherboard connection terminals 45. In the case where this dissimilar metal layer 48 has a sufficient thickness, the plating layer 49 may be formed by performing only electroless gold plating, without performing electroless nickel plating.

Therefore, the present embodiment can yield the following effects.

(1) In the present embodiment, each of the metal conductor portions 58, which are to become the motherboard connection terminals 45, is formed by the metal-conductor-portion lower layer 58a formed on the copper foil 55 of the metal laminate sheet 54, the dissimilar metal layer 48 formed on the upper end surface of the metal-conductor-portion lower layer 58a, and the metal-conductor-portion upper layer 58b formed on the upper end surface of the metal-conductor-portion lower layer 58a via the dissimilar metal layer 48. Since the dissimilar metal layer 48 is formed of a metal which is lower in etching rate than a copper layer which mainly constitutes the metal conductor portions 58, the dissimilar metal layer 48 functions as an etching stop layer. That is, in the connection-terminal forming step, etching can be controlled in such a manner that the metal-conductor-portion lower layers 58a are gradually removed through etching, and etching removal stops at the dissimilar metal layer 48. Since this configuration can prevent excessive removal of the metal conductor portions 58 through etching, the adhesion between the resin insulation layer 20 and the motherboard connection terminals 45 can be secured sufficiently. Furthermore, through etching removal of the metal-conductor-portion lower layers 58a, the openings 37 are formed in the outermost resin insulation layer 20, and the metal-conductor-portion upper layers 58b, which are greater in area than the openings 37, remain on the inner layer (interior) side of the resin insulation layer 20. The metal-conductor-portion upper layers 58b remaining on the inner layer (interior) side of the resin insulation layer 20 are used as the motherboard connection terminals 45. When the motherboard connection terminals 45 are formed in this manner, each of the motherboard connection terminals 45 has a structure in which a peripheral portion of the terminal outer surface 45a is covered by the resin insulation layer 20, whereby the strength of the motherboard connection terminals 45 can be increased sufficiently. Also, stress acting at the boundary between each of the motherboard connection terminals 45 and the resin insulation layers 20 and 21 can be mitigated. Moreover, since the boundary is not straight, various chemicals and the like are less likely to soak into the interior of the substrate via the boundary. As a result, the possibility of generation of cracks in the resin insulation layers 20 and 24 decreases, and the multilayer wiring substrate 10 has an improved reliability as compared with conventional ones.

(2) In the multilayer wiring substrate 10 of the present embodiment, the outermost resin insulation layer 20 is formed of the same build-up material as that used for forming the inner layers. Therefore, the influence of the difference in thermal expansion coefficient in the wiring laminate portion 30 can be mitigated as compared with the case where the outermost resin insulation layer 20 is formed of a different resin insulation material. As a result, warpage of the multilayer wiring substrate 10 can be restrained.

(3) In the multilayer wiring substrate 10 of the present embodiment, in the connection-terminal forming step, the exposed copper foil 55 and the metal-conductor-portion lower layers 58a are removed through etching, to thereby form the plurality of opening 37 in the resin insulation layer 20, which is the outermost layer on the bottom surface 32 side, and the plating layer 49 is formed, as a protection metal layer, on the dissimilar metal layer 48 exposed inside each opening 37. When the motherboard connection terminals 45 are formed in this manner, the plating layer 49 can reliably protect the motherboard connection terminals 45, whereby the reliability of the multilayer wiring substrate 10 can be improved.

(4) In the multilayer wiring substrate 10 of the present embodiment, the terminal inner surface 45c of each motherboard connection terminal 45 is rounded along the edge 45d thereof. Since this confiscation eliminates the concentration of stress at edge portions of the motherboard connection terminals 45, the possibility of generation of cracks in the resin insulation layer 20 decreases, and the multilayer wiring substrate 10 has an improved reliability as compared with conventional ones.

(5) In the multilayer wiring substrate 10 of the present embodiment, on the top surface 31 side of the wiring laminate portion 30, two types of connection terminals; i.e., the IC-chop connection terminals 41, to which an IC chip is connected, and the capacitor connection terminals 42, to which chip capacitors are connected and which is larger in area than the IC-chip connection terminals 41, are present as the plurality of first-main-surface-side connection terminals. In this case, an IC chip can be reliably connected to the IC-chip connection terminals 41, which are small in area, and chip capacitors can be reliably connected to the capacitor connection terminals 42, which are large in area. Moreover, since the motherboard connection terminals 45, which are greater in area than the connection terminals 41 and 42 provided on the top surface 31 side, are present on the bottom surface 32 side of the wiring laminate portion 30, the connection terminals 45 can be reliably connected to a motherboard.

(6) In the present embodiment, after the metal conductor portions 58, which are to become the motherboard connection terminals 45, are formed in a predetermined pattern, the inner conductive layers 26 of the wiring laminate portion 30 are laminated. Therefore, positional shift between the motherboard connection terminals 45 and the inner conductive layers 26 can be prevented. Moreover, since the motherboard connection terminals 45 are not required to be formed in a predetermined pattern after the base-material removing step, the multilayer wiring substrate 10 can be manufactured relatively easily.

Notably, the embodiment of the present invention may be modified as follows.

Figure 21:
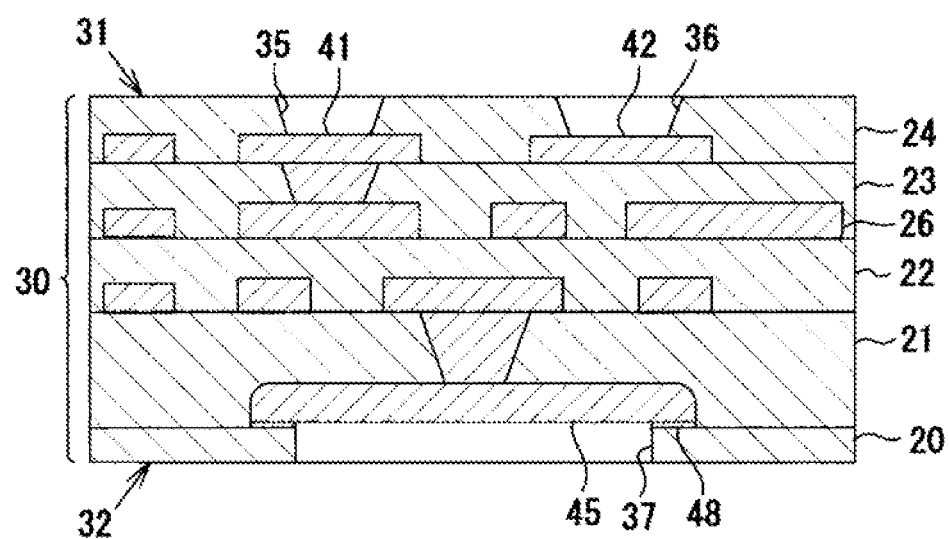
FIG. 21 is an explanatory view showing the method of manufacturing the multilayer wiring substrate.

In the multilayer wiring substrate 10 according to embodiment, the dissimilar metal layer 48 is formed through performance of electroless nickel plating. However, the metal used for forming the dissimilar metal layer 48 is not limited thereto. The dissimilar metal layer 48 may be formed by use of a metal other than nickel, for example, gold, chromium, titanium, or cobalt. Further, the dissimilar metal layer 48 may be formed by a method other than plating, for example, sputtering or the like. Specifically, in the case where the dissimilar metal layer 48 is formed through sputtering of chromium, in the connection-terminal forming step, the dissimilar metal layer 48 exposed inside the openings 37 may be removed by use of a dedicated etchant (see FIG. 21).

Figure 22:
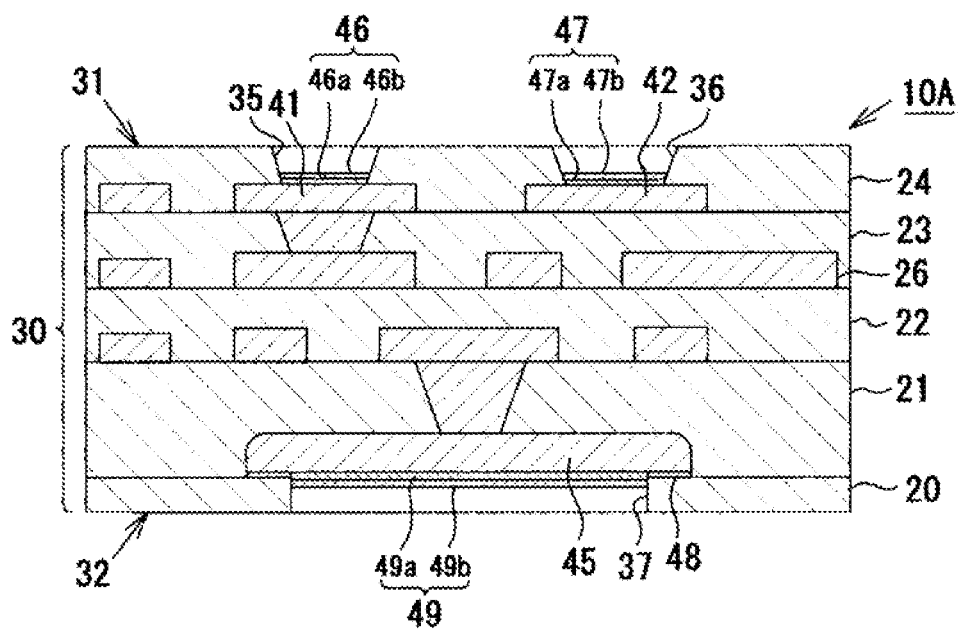
FIG. 22 is a sectional view schematically showing the structure of a multilayer wiring substrate according to another embodiment.

After that, as shown in FIG. 22, electroless nickel plating and electroless gold plating are sequentially performed on the surface of the copper layer of the motherboard connection terminals 45 exposed inside the openings 37 so as to form the plating layer 49, to thereby manufacture a multilayer wiring substrate 10A.

In this multilayer wiring substrate 10A as well, the dissimilar metal layer 48 is formed at the boundary between the inner main surface 20a of the outermost resin insulation layer 20 and the peripheral portion of the terminal outer surface 45a of each motherboard connection terminal 45 (copper layer). Chromium used to form the dissimilar metal layer 48 has a higher adhesion to resin than copper. Therefore, through interposition of the dissimilar metal layer 48 between the peripheral portion of the terminal outer surface 45a and the resin insulation layer 20, sealing performance increases, and various chemicals become less likely to soak into the interior of the substrate via the boundary. Moreover, the plating layer 49 can be reliably formed on the surface of the copper layer of each motherboard connection terminal 45, the reliability of the multilayer wiring substrate 10A is improved.

In the multilayer wiring substrates 10 and 10A according to embodiments, the IC-chip connection terminals 41 and the capacitor connection terminals 42 (first-main-surface-side connection terminals) are formed such that they are covered by the outermost resin insulation layer 24, and have the same height. However, the configuration of the connection terminals 41 and 42 are not limited thereto.

Figure 23:
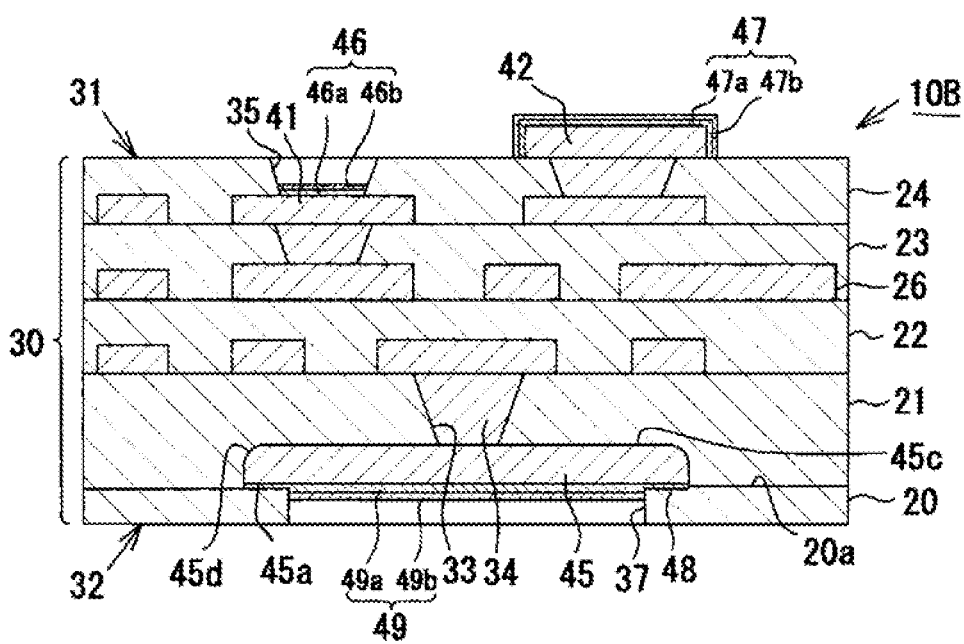
FIG. 23 is a sectional view schematically showing the structure of a multilayer wiring substrate according to another embodiment.

For example, as in a multilayer wiring substrate 10B shown in FIG. 23, the capacitor connection terminals 42 may be formed such that they project from the outermost resin insulation layer 24. Notably, in the multilayer wiring substrate 10B, the upper and side surfaces of each capacitor connection terminal 42 are covered with the plating layer 47.

Figure 24:
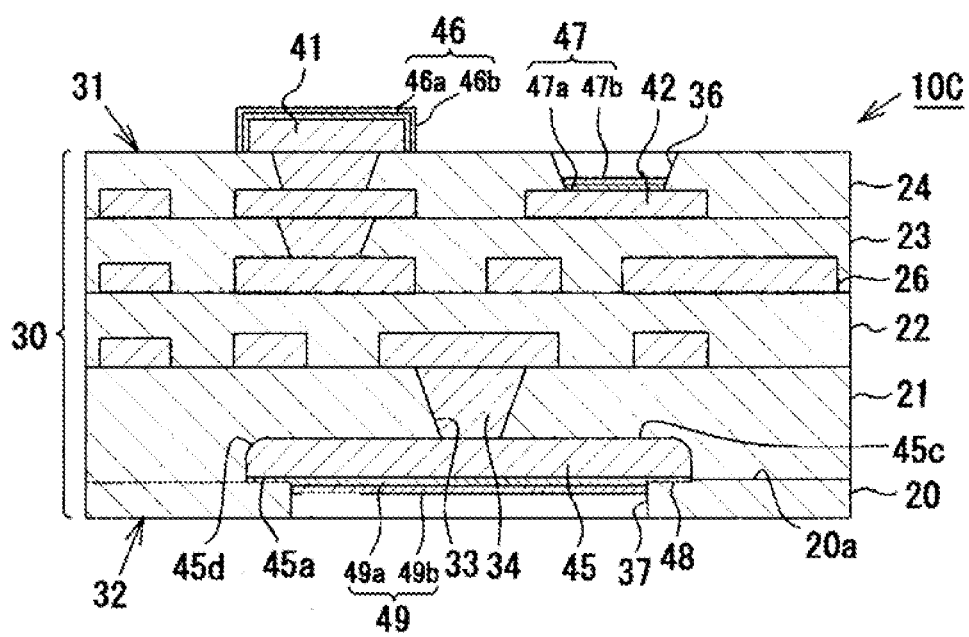
FIG. 24 is a sectional view schematically showing the structure of a multilayer wiring substrate according to another embodiment.
Figure 25:
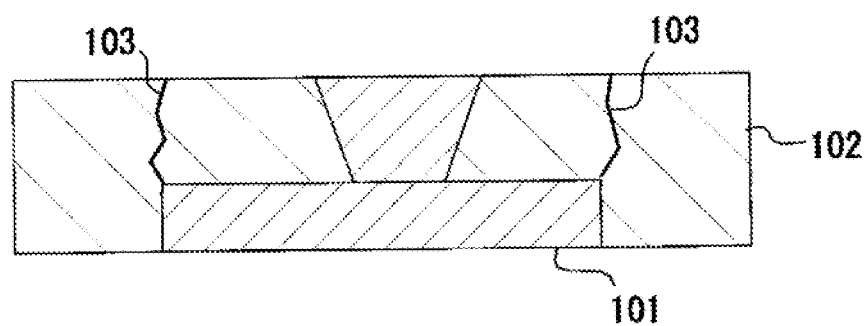
FIG. 25 is an enlarged sectional view showing a conventional multilayer wiring substrate.

Furthermore, as in a multilayer wiring substrate 10C shown in FIG. 24, the IC-chip connection terminals 41 may be formed such that they project from the outermost resin insulation layer 24. In this multilayer wiring substrate 10C, the upper and side surfaces of each IC-chip connection terminal 41 are covered with the plating layer 46. In the case where the IC-chip connection terminals 41 and the capacitor connection terminals 42 are rendered different in height as in the multilayer wiring substrates 10B and 10C shown in FIGS. 23 and 24, components (IC chips and chip capacitors) of different types can be reliably connected to the connection terminals 41 and 42.

In the above-described second embodiment, in the metal-conductor-portion-lower-layer exposing step, buffing is performed so as to expose the upper end surfaces of the metal-conductor-portion lower layers 58a from the resin insulation layer 20. However, the method of exposing the upper end surfaces of the metal-conductor-portion lower layers 58a is not limited thereto. The upper end surfaces of the metal-conductor-portion lower layers 58a may be exposed from the resin insulation layer 20 by performing surface polishing, other than buffing, or machining by use of a laser or plasma.

In the above-described embodiments, the plurality of conductive layers 26 formed in the plurality of resin insulation layers 21 to 24 are connected with one another through the via conductors 34 whose diameters increase in a direction from the bottom surface 32 to the top surface 31. However, their structures are not limited thereto. The via conductors 34 formed in the plurality of resin insulation layers 21 to 24 may have any shape so long as their diameters increase in the same direction; and the plurality of conductive layers 26 may be connected with one another through via conductors whose diameters increase in a direction from the top surface 31 to the bottom surface 32.

In the above-described embodiments, each of the plating layers 46, 47, and 49, which cover the connection terminals 41, 42, and 45, respectively, is a nickel-gold plating layer. However, the nickel-gold plating layer can be replaced with any other plating layer, such as nickel-palladium-gold plating layer, so long as the plating layer is formed of a material other than copper.

DESCRIPTION OF REFERENCE NUMERALS

10, 10A to 10C: multilayer wiring substrate
20 to 24: resin insulation layer
20a: inner main surface
26: conductive layer
30: wiring laminate portion (laminate structure)
31: top surface (first main surface)
32: bottom surface (second main surface)
34: via conductor
37: opening
41: IC-chip connection terminal (first-main-surface-side connection terminal)
42: capacitor connection terminal (first-main-surface-side connection terminal)
45: motherboard connection terminal (second-main-surface-side connection terminal)
45a: terminal outer surface
48: dissimilar metal layer
49: plating layer (protection metal layer)
52: base material
55: copper foil (metal foil)
58: metal conductor portion
58a: metal-conductor-portion lower layer
58b: metal-conductor-portion upper layer
72: plating resist film
72a: opening

What is claimed is:

1. A multilayer wiring substrate comprising a laminate structure in which a plurality of resin insulation layers made primarily of a same resin insulation material, and a plurality of conductive layers are laminated alternately in multilayer arrangement, a plurality of first-main-surface-side connection terminals being disposed on a first main surface side of the laminate structure, a plurality of second-main-surface-side connection terminals being disposed on a second main surface side of the laminate structure, the plurality of conductive layers being formed in the plurality of resin insulation layers and interconnected by means of via conductors whose diameters increase toward the first main surface side of the laminate structure or the second main surface side of the laminate structure, wherein:
   an outermost resin insulation layer on the second main surface side of the laminate structure has a plurality of openings which expose portions of terminal outer surfaces of the second-main-surface-side connection terminals;
   the second-main-surface-side connection terminals are primarily comprised of a copper layer, and peripheral portions of the terminal outer surfaces of the second-main-surface-side connection terminals are covered by the outermost resin insulation layer; and
   a dissimilar metal layer made of at least one metal which is lower in etching rate than copper is formed between an inner main surface of the outermost resin insulation layer and at least the peripheral portions of the terminal outer surfaces.

2. A multilayer wiring substrate according to claim 1, wherein the dissimilar metal layer is formed of at least one metal selected from the group consisting of gold, nickel, chromium, titanium, cobalt, palladium, tin, and silver.

3. A multilayer wiring substrate according to claim 1, wherein the via conductors formed in the plurality of resin insulation may have any shape so long as their diameters increase in the same direction.

4. A multilayer wiring substrate according to claim 1, further comprising plating layers that cover the connection terminals, the plating layers being a nickel-gold plating layer or a nickel-palladium-gold plating layer.

5. A multilayer wiring substrate according to claim 1, wherein the second-main-surface-side connection terminals are embedded in a resin insulation layer that is not the outermost resin insulation layer.

6. A method of manufacturing the multilayer wiring substrate of claim 1, the method comprising:
   a metal-conductor-portion-lower-layer forming step of preparing a base material on which a metal foil is separably laminated, and performing copper plating so as to form metal-conductor-portion lower layers, which constitute portions of metal conductor portions, on the metal foil;

a resin-insulation-layer forming step of, after the metal-conductor-portion-lower-layer forming step, laminating on the metal foil and the metal-conductor-portion lower layers a build-up material made primarily of the resin insulation material, to thereby form the outermost resin insulation layer on the second main surface side of the laminate structure;

a metal-conductor-portion-lower-layer exposing step of exposing upper end surfaces of the metal-conductor-portion lower layers from the outermost resin insulation layer on the second main surface side of the laminate structure;

a dissimilar-metal-layer forming step of, after the metal-conductor-portion-lower-layer exposing step, forming the dissimilar metal layer on the upper end surfaces of the metal-conductor-portion lower layers and the outermost resin insulation layer on the second main surface side, the dissimilar metal layer being formed of the at least one metal which is lower in etching rate than copper;

a metal-conductor-portion-upper-layer forming step of forming metal-conductor-portion upper layers on the dissimilar metal layer at positions corresponding to the upper end surfaces of the metal-conductor-portion lower layers, the metal-conductor-portion upper layers being greater in area than the upper end surfaces and constituting portions of the metal conductor portions;

a build-up step of, after the metal-conductor-portion-upper-layer forming step, laminating the plurality of resin insulation layers made of the build-up material, and the plurality of conductive layers alternately in multilayer arrangement, to thereby form the laminate structure;

a base-material removing step of, after the build-up step, removing the base material to thereby expose the metal foil; and a connection-terminal forming step of removing the metal foil and at least portions of the metal conductor portions, to thereby form the plurality of second-main-surface-side connection terminals.

7. The method of claim 1, wherein a resist-film forming step is performed between the dissimilar-metal-layer forming step and the metal-conductor-portion-upper-layer forming step so as to form on the dissimilar metal layer a plating resist film having openings at positions corresponding to the upper end surfaces, the openings being greater in area than the upper end surfaces; and a resist-film removing step and a dissimilar-metal-layer removing step are performed between the metal-conductor-portion-upper-layer forming step and the build-up step, the resist-film removing step removing the resist film, and the dissimilar-metal-layer removing step partially removing the dissimilar metal layer through etching of exposed portions of the dissimilar metal layer.

8. The method of claim 1, wherein in the connection-terminal forming step, the exposed metal foil and the metal-conductor-portion lower layers are removed through etching so as to form the plurality of openings in the outermost resin insulation layer on the second main surface side, and a protection metal layer is formed on the dissimilar metal layer exposed inside the openings, whereby the plurality of second-main-surface-side connection terminals are formed.

9. The method of claim 1, wherein in the connection-terminal forming step, the exposed metal foil and the metal-conductor-portion lower layers are removed through etching so as to form the plurality of openings in the outermost resin insulation layer on the second main surface side, the dissimilar metal layer exposed inside the openings is removed through etching, and a protection metal layer is formed on the exposed metal-conductor-portion upper layers, whereby the plurality of second-main-surface-side connection terminals are formed.

10. The method of manufacturing a multilayer wiring substrate according to claim 1, wherein the dissimilar metal layer is formed of at least one metal selected from a group consisting of gold, nickel, chromium, titanium, cobalt, palladium, tin, and silver.

* * * * *